United States Patent
Hall

Patent Number: 5,929,838
Date of Patent: Jul. 27, 1999

[54] ACQUISITION MANAGER AND METHOD FOR ALTERNATING DIGITAL OSCILLOSCOPE OPERATION BETWEEN FAST UPDATE RATE AND LONG RECORD LENGTH

[75] Inventor: Stuart O. Hall, Colorado Springs, Colo.

[73] Assignee: Hewlett-Packard Company, Palo Alto, Calif.

[21] Appl. No.: 08/633,936

[22] Filed: Apr. 17, 1996

[51] Int. Cl.⁶ .................................................. G09G 5/36
[52] U.S. Cl. ............................................. 345/134; 702/67
[58] Field of Search ................................. 345/133, 134; 364/487, 920; 368/115; 455/148; 324/121 R; 702/67, 70, 80

[56] References Cited

U.S. PATENT DOCUMENTS

| | | | |
|---|---|---|---|
| 4,134,149 | 1/1979 | Nord | 345/134 |
| 4,555,765 | 11/1985 | Crooke et al. | 324/121 R |
| 4,743,844 | 5/1988 | Odenheimer et al. | 324/121 R |
| 5,115,189 | 5/1992 | Holcomb | 324/121 R |
| 5,283,667 | 2/1994 | Kojima et al. | 358/462 |
| 5,397,981 | 3/1995 | Wiggers | 324/121 R |
| 5,412,579 | 5/1995 | Meadows et al. | 345/435 |
| 5,444,459 | 8/1995 | Moriysan | 345/134 |
| 5,493,648 | 2/1996 | Murray et al. | 345/507 |
| 5,594,655 | 1/1997 | Berchin | 364/487 |
| 5,790,133 | 8/1998 | Holcomb | 345/501 |

*Primary Examiner*—Jeffery Brier
*Assistant Examiner*—Paul A. Bell

[57] ABSTRACT

A digital acquisition system maximizes the number of points captured when a user issues a stop command, while maximizing the update rate during continuous operation. In essence, the present invention utilizes an optimum update rate (i.e., set so as to capture a minimum number of points), while operating in a continuous fashion. Upon receiving a stop command for the user, the present invention sets up to take a deep memory acquisition at a slower update rate (i.e., set so as to capture a maximum number of points). If a trigger is received within a predetermined period of time after the stop command is received, then a deep memory acquisition is taken, and the captured points are displayed to the user for viewing. If a trigger is not received within the predetermined period of time after the stop command is received, then the last acquisition taken at the optimum update rate remains displayed for viewing by the user.

17 Claims, 6 Drawing Sheets

ACQUISITION MANAGER AND METHOD FOR ALTERNATING DIGITAL OSCILLOSCOPE OPERATION BETWEEN FAST UPDATE RATE AND LONG RECORD LENGTH

FIELD OF THE INVENTION

This invention generally relates to digital acquisition systems, and more particularly, to a system and method for providing deep memory acquisitions during a stop mode of a digital acquisition system without reducing the display update rate of the digital acquisition system while the system is running.

BACKGROUND OF THE INVENTION

Analog oscilloscopes have long been the most utilized instruments for viewing waveforms. However, with recent advancements in digital integrated circuits and processing power, digital storage oscilloscopes (DSO) have become a more viable alternative to analog oscilloscopes. In fact, DSOs offer several advantages over analog oscilloscopes, such as the ability to make automatic measurements on the digital data and the ability to store the digital data in memory for post processing viewing, generating a hard copy, uploading to a computer, or storing on a diskette. However, many engineers and technicians are resisting the transition from analog oscilloscopes to DSOs. One of the reasons that the transition to DSOs has met some resistance is the fact that analog oscilloscopes have been able to provide superior update rates. The significance of the update rate is that it indicates the number of the waveforms that are displayed per unit of time (i.e., the amount of data that is being displayed real-time). The more data displayed per unit of time, that is, the faster the update rate, the more informative is the waveform displayed by the instrument. Accordingly, manufacturers of DSOs have begun to emphasize update rate in their design criteria. However, a traditional downside to increasing the update rate in a DSO is the reduction in the number of data points captured for viewing when the user issues a stop command so as to freeze the screen for viewing the waveform statically.

For example, the display of a DSO is designed to display a fixed number of data points. The first data point represents the input waveform amplitude at the absolute time represented by the left edge of the display. The last data point represents the input waveform amplitude at the absolute time represented by the right edge of the display. If the displayed time is Td and the number of points displayed is Np, then the sample period required for the acquisition system of the DSO is given by the quotient Td/Np. Assuming the sample rate does not change, then the time required to capture X*Np points is X*Td. The number of points acquired over Np are not displayed, but represent the waveform amplitude at the absolute time to the left of the display edge and/or the absolute time to the right of the display edge. These non-displayed points are of essentially no value, until the user issues a stop command so that the waveform can be viewed in detail. When the stop command is issued, then the captured non-displayed points provide the user with more of the waveform to pan and zoom for a detailed examination.

Thus, the limiting factor in optimizing the update rate, which is preferably set at its maximum, is the time required to capture Np points. If Td is constant, then as Np increases, the update rate decreases, or becomes slower. Therefore, in order to maximize the update rate, no more than Np points should be captured for each acquisition of data. If it is desirable to capture more than Np points (e.g. X*Np), then the time required for each update becomes X*Td, thereby slowing the update rate. For instance, if Td is 1 millisecond, then the theoretical update rate limit is 1000 screen updates per second. If, however, the instrument is designed to capture 100 screens worth of data per acquisition so that a predetermined amount of data is available for detailed viewing in a stopped mode, then the update rate is only 10 screen updates per second. Thus, there is a direct trade-off between the amount of data the user is able to capture for detailed viewing and the update rate during continuous operation.

In the past, designers of DSOs have addressed this trade-off between the update rate and the size of each acquisition by either living with an undesirably slow update rate or by minimizing the number of points per acquisition. Alternatively, designers have included controls that allow the user to adjust the trade-off for a particular application. In this case, the user is provided with memory depth control so as to allow the user to select the desired memory depth. A problem with this approach is the complexity that this feature adds to the human interface with the instrument. Not only is the user required to know how to change the memory depth, the user must have a reasonable understanding of digitizing acquisition systems to fully understand the ramifications of any change. For instance, the user must be cognizant of the fact that increasing the memory depth means that the update rate will become slower. Conversely, the user must be cognizant of the fact that increasing the memory depth will make more waveform data available for viewing when close examination of the waveform is desired. In this same sense, the user must be knowledgeable enough to know that if the update rate is too slow, the user may select a smaller memory depth so that less data is captured each acquisition, thereby increasing the update rate. Lastly, it is also recognized that calculating the precise memory depth necessary to solve a particular problem which a user is attempting to solve with the DSO is no small task in and of itself, and it is oftentimes above the knowledge base of the user.

Thus, a heretofore unaddressed need exists in the industry for a DSO capable of making deep memory acquisitions for detailed examination of a waveform without having to reduce the update rate of the DSO when the instrument is continuously running.

SUMMARY OF INVENTION

The present invention overcomes the deficiencies and inadequacies of the prior art as described hereinbefore. The present invention provides for an acquisition manager for maximizing the number of points that a digital storage oscilloscope (DSO) or any digital waveform acquisition system captures when the user issues a stop command while maximizing the update rate during continuous operation. In accordance with the present invention, a DSO operates at an optimum update rate during real time viewing of the waveform in a continuous operating mode until a stop command is issued by the user. At that point, the acquisition manager automatically modifies the operation of the DSO so that a deep memory acquisition is taken for static viewing of the waveform. The acquisition manager operates in the background of the DSO during continuous operation so that the user is not required to have any understanding of digitizing acquisitions systems nor is the user required to make any instrumentation changes to adjust the memory depth.

Briefly stated, the present invention provides for an acquisition manager that controls the acquisition of data comprising a record when a stop command is issued by the user. Prior to receiving a stop command, the DSO operates at an optimum update rate, whereby a minimum amount of data is captured at each trigger. Once a user issues a stop (or freeze) command in order to view the waveform statically, then the acquisition manager sets up to take a deep memory acquisition in order to provide the user with a maximum amount of data possible for a detailed examination of the waveform. The acquisition manager then looks for a subsequent trigger after the stop command has been issued so that a deep memory acquisition can be taken.

If a trigger does not occur within a predetermined period of time after the stop command, then the last record of acquired data captured at the continuous update rate is displayed. If a trigger does occur within the predetermined period of time after the stop command, then a deep memory acquisition is taken to create a new record for displaying to the user.

In the preferred embodiment, the acquisition manager is configured as a part of the acquisition system for receiving and processing the input waveform, and for sending the resulting data records to a display memory. The acquisition manager performs acquisition-specific tasks such as acquiring a single record of data at each trigger for storage in an acquisition memory, determining the record length when running continuously, determining the record length for a deep memory acquisition, and determining the amount of data to be captured before and after a trigger. While the acquisition manager performs acquisition-specific tasks, additional processing is performed by a processing system of the DSO for providing functionalities such as providing human interface, display processing, and post processing.

The acquisition system, including the acquisition manager, can be implemented as software, firmware, hardware, or any combination thereof. In the preferred embodiment, it is noted that the acquisition manager is implemented via firmware and hardware, though one of ordinary skill in the art would recognize that the acquisition manager can be implemented in a wide variety of combinations of software, firmware, and hardware. The functionality embodied in firmware in the preferred embodiment includes the timing, calculation of memory depth, and human input sensing. The functionality embodied in hardware in the preferred embodiment includes acquisition of a trigger, display updating, and trigger status.

The present invention also provides for and can be thought of as a method of digital memory acquisition in a digital waveform acquisition system comprising the following steps. Initially, a DSO is processing small, fast acquisitions at an optimum update rate in order to provide the user with more waveforms per unit time. Once a stop command has been received, the acquisition manager starts a timer and sets the acquisition system up for a deep memory acquisition of maximum depth. The acquisition manager then waits for a subsequent trigger. If a subsequent trigger is received before the timer expires, the acquisition manager takes a deep memory acquisition and transfers the acquired record of data to the display memory for viewing by the user. If a trigger is not received before the timer expires, the acquisition manager leaves the last acquired record taken at the fast update rate in the display memory for viewing by the user. Once displayed, user is able to "pan and zoom" the record.

An advantage of the present invention is that the user of a DSO incorporating the present invention is not required to understand digital acquisition systems in order to make a determination of how much memory depth is needed.

Another advantage of the present invention is that it maximizes the performance of an acquisition system in order to meet the needs of the user during both continuous viewing or static viewing of the displayed waveform.

Another advance of the present invention is that it provides for a scheme for deep memory acquisition that is simple in design, reliable, and efficient.

Other features and advantages of the present invention will become apparent to one with skill in the art upon examination of the following drawings and detailed descriptions. It is intended that all such additional features and advantages be included herein within the scope of the present invention, as defined by the appended claims.

BRIEF DESCRIPTION OF THE DRAWINGS

The present invention can be better understood with reference to the following drawings. The elements of the drawings are not necessarily to scale; emphasis instead is being placed upon clearly illustrating the principles of the present invention. Furthermore, like reference numerals designate corresponding parts throughout the several views.

DETAILED DESCRIPTION OF THE PREFERRED EMBODIMENT

The following description is of the best presently contemplated mode of carrying out the present invention. This description is not to be taken in a limited sense, but is made merely for the purpose of describing the general principles of the invention. The present invention is not to be limited to the particular implementation of the preferred embodiment or to any particular implementation in software, firmware, hardware, or any combination thereof. Instead, it is recognized that the present invention can be easily implemented in any number of ways, but preferably it is implemented as a combination of firmware and hardware. Therefore, the scope of the invention should be determined by referencing the appended claims.

In the preferred embodiment, the present invention is implemented in firmware and hardware. The firmware provides the operational logic while the hardware provides the physical implementation for the handling of the signals in an optimum configuration for ensuring the fastest operation possible. The firmware for implementing the preferred embodiment includes a program comprising executable instructions encoded on a ROM or EPROM memory device, and the hardware for implementing the preferred embodiment includes digital integrated circuit components such as digital signal processors, custom application specific integrated circuits (ASIC), and analog-to-digital converts.

I. Architecture

Figure 1:
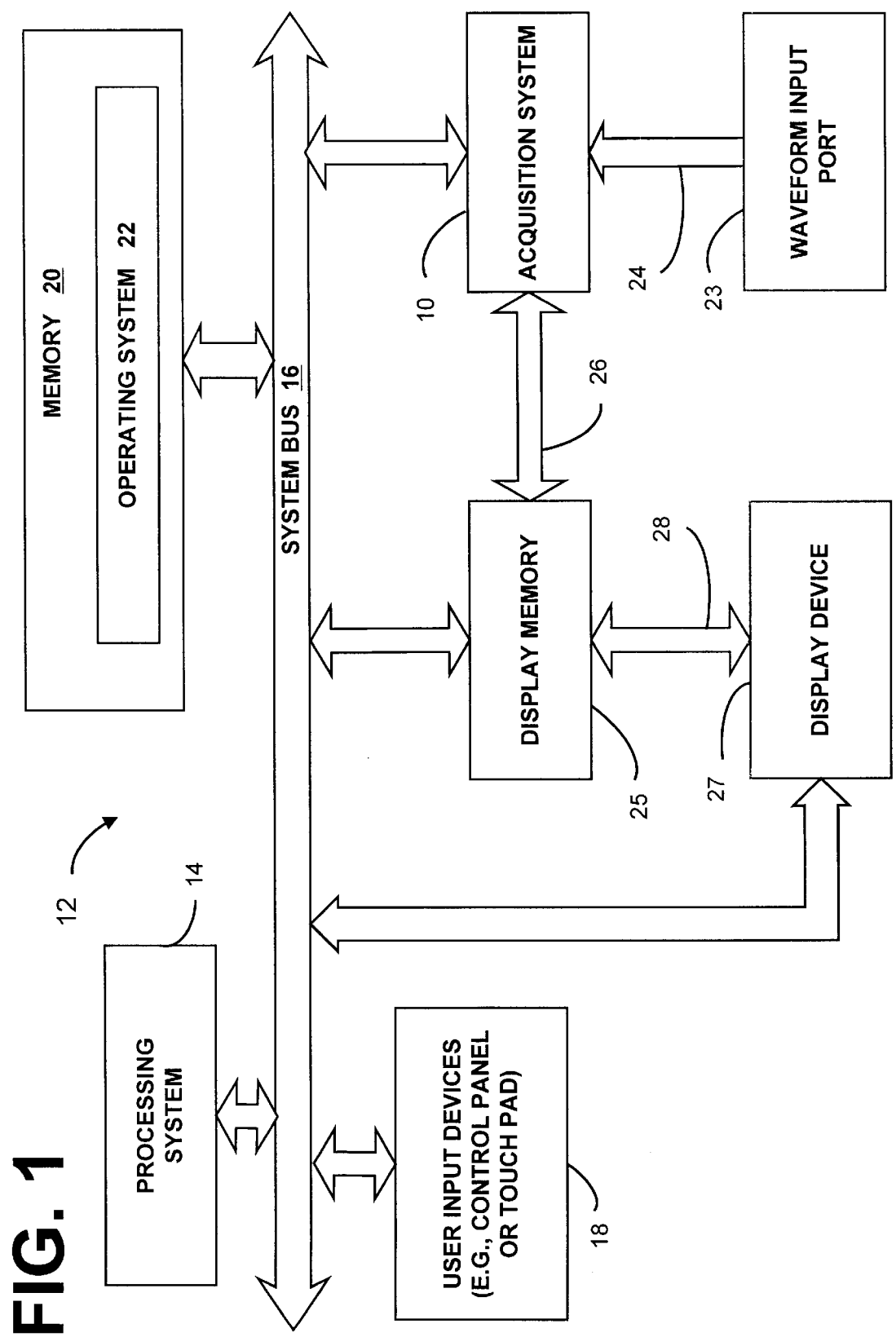
FIG. 1 is a block diagram of a digital storage oscilloscope that incorporates an acquisition system in accordance with the present invention.

With reference now to the drawings, FIG. 1 shows an acquisition system 10 in accordance with the present invention in the context of a digital storage oscilloscope (DSO) 12. The DSO 12 comprises a processing system 14 that includes one or more processors for providing functionality such as human interface, display processing and post processing. The processing system 14 communicates to other elements within the DSO 12 via a system bus 16. The user is provided with an input device 18, for example, a control panel or touch pad, for inputting control commands and providing instrument settings for the operation of the DSO 12. A memory 20 within the DSO 12 stores an operating system 22 that allows the DSO 12 to implement a digital storage acquisition system via the processing system 14 and acquisition manager 10.

A waveform input port 23 is provided to receive input waveform signals and to deliver the signals to the acquisition system 10 over interface 24. The acquisition system 10 is configured to acquire records of different size from the input waveform signals, as will be discussed in detail hereinafter. For purposes of the present invention, a record is a collection of sampled data points representing a discrete portion of a waveform captured by the acquisition system 10 in response to a single trigger.

A display memory 25 receives the acquired records from the acquisition system 10 over interface 26. The acquired records are then sent to a display device 27 over interface 23 for displaying to the user. The display device 27 further receives control information from the processing system 14 over the system bus 16 that tells the display device 27 what to do with the records.

Figure 2:
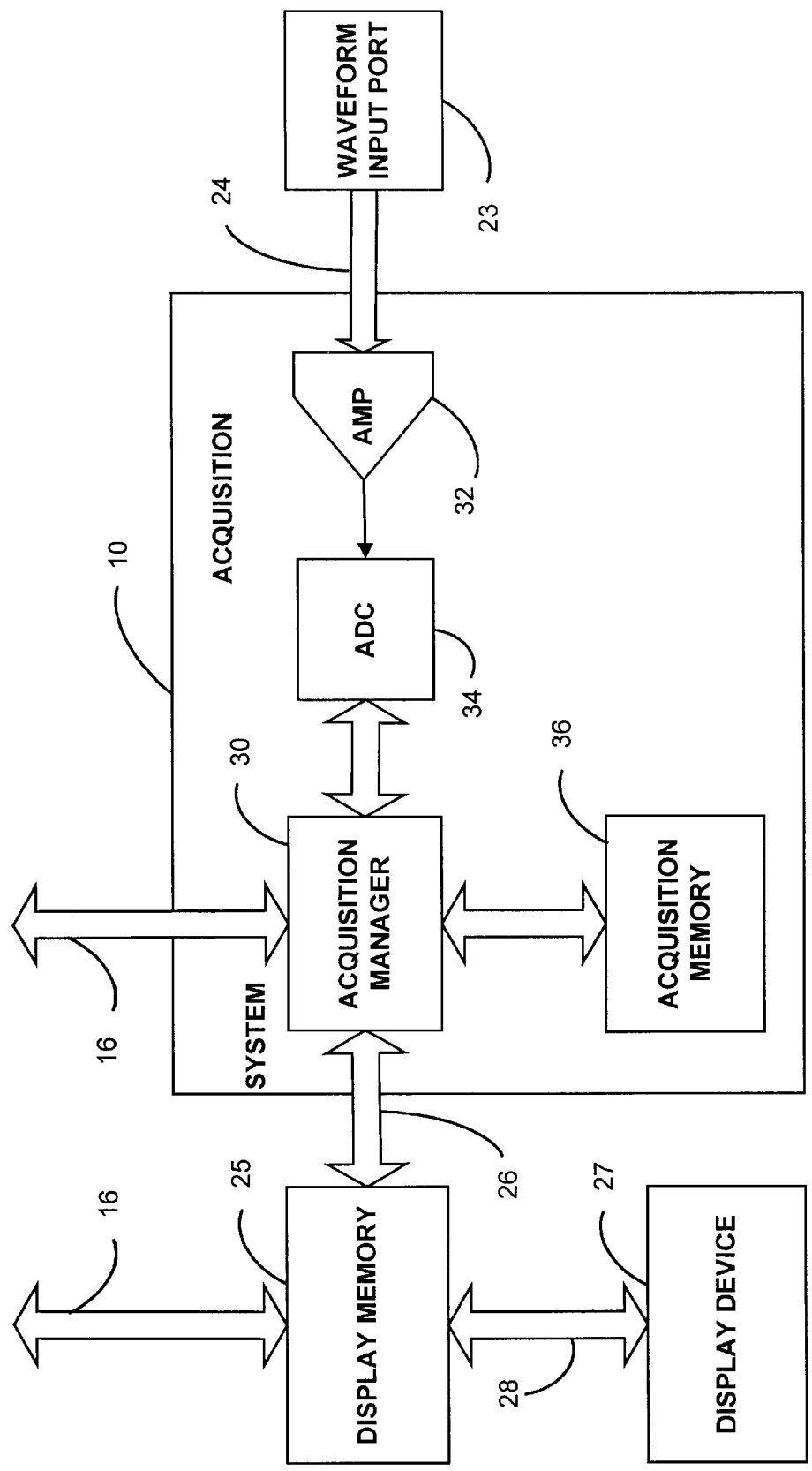
FIG. 2 is a block diagram of the acquisition system of FIG. 1.

With reference now to FIG. 2, the acquisition system 10, of the present invention includes an acquisition manager 30 that performs the supervisory tasks that control the operation of acquisition system 10, as discussed below with reference to FIG. 3. The acquisition system 10 further includes an amplifier 32 that amplifies the input waveform received from the waveform input port 23 to a fixed voltage, and an analog to digital convertor (ADC) 34 that samples the input waveform, converting it into a digital format for processing by the acquisition manager 30. It is noted that the operation of amplifier 32 and ADC 34 can alternatively be implemented with a comparator or any other suitable device.

An acquisition memory 36 is provided by the acquisition system 10 for storing one or more records of data captured by the acquisition system 10 at each trigger. For purposes of the present discussion, a trigger is a zero time reference for the acquisition system 10 that determines the time relationship between the waveform signal being acquired or captured, and the data being displayed on display device 27. Accordingly, at each trigger, a record of data is acquired or captured by the acquisition manager 30 and temporarily stored in the acquisition memory 36 before being transferred to the display memory 25. From the display memory 25, the data is transferred to the display device 27 for viewing by the user.

Figure 3:
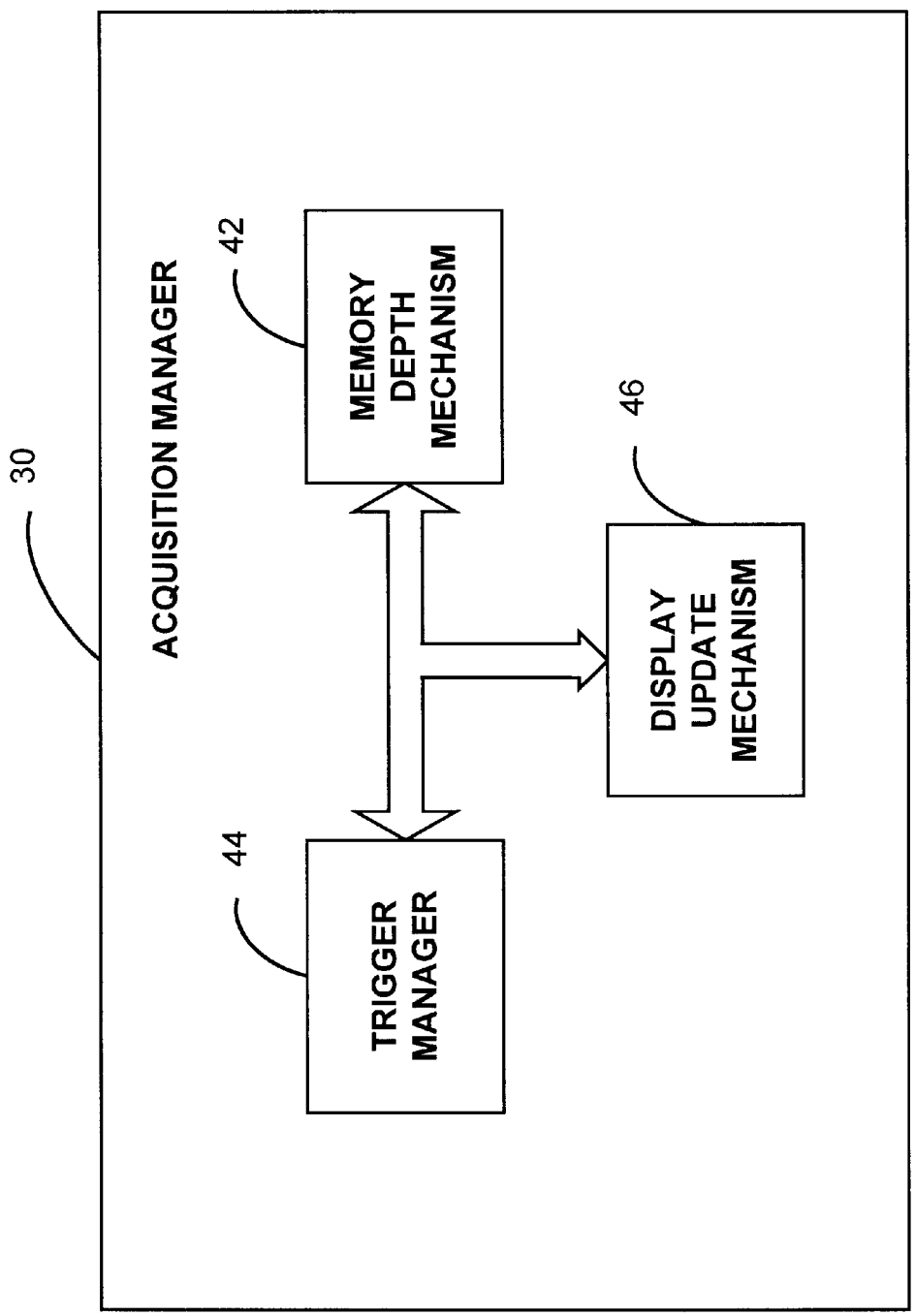
FIG. 3 is a block diagram of the preferred embodiment of the acquisition system of FIG. 2.

With reference now to FIG. 3, the functional components of the preferred embodiment of the acquisition manager 30 are illustrated. The acquisition manager 30 includes a memory depth mechanism 42, a trigger mechanism 44, and a display update mechanism 46. The memory depth mechanism 42 is configured to first determine and then set up the memory depth for data acquisition purposes. Specifically, the memory depth mechanism 42 determines the amount of data before and after the trigger that is captured by the acquisition manager 30. The trigger mechanism 44 is configured to record the trigger status and provide the address of the data point closest to the trigger, referred to as the sample trigger. Thus, the amount of data to be captured before and after each trigger as determined by the memory depth mechanism 42 is taken in reference to the sample trigger. Lastly, the display update mechanism 46 is configured to transfer each record of data from the acquisition memory 36 to the display memory 25. Specifically, the display update mechanism 46 determines, for each record, where in the acquisition memory 36 to the start reading out data and where in the display memory 25 to start writing data. As will be readily appreciated by one of ordinary skill in the art, the functionality discussed herein with regard to the acquisition manager 30 can be implemented in software, firmware, hardware, or any combination thereof.

II. Operation

The preferred operation and sequence of events corresponding with the acquisition manager 30 of the present invention and the associated methodology are described hereafter.

In accordance with an important feature of the present invention, the DSO 12 operates at an optimum update rate when continuously running, so that only a minimum amount of data is captured by the acquisition manager and stored in the acquisition memory 36 at each trigger before being sent to the display memory 25. This optimizes the operation of DSO 12 in continuous running mode. As described before in the Background section, the present trade-off to this is that when the user wishes to examine the waveform in detail by stopping the display (or freeze the display), the ability of the user to examine any detail of the waveform more closely is limited by the fact that only a small amount of data was captured because of the fast update rate. Alternatively, if a large amount of data is captured for each record, the update rate would be undesirably slow and hamper the operation of the DSO 12 in a continuous running mode.

As a solution, the acquisition manager 30 of the present invention provides small fast acquisitions during continuous operation so as to maintain an optimum update rate while viewing the waveform real time, and provides a single large record of data via a deep memory acquisition when the user issues a stop command so as to capture a maximum amount of data for a detailed examination of the waveform. In essence, a first memory depth is chosen for the optimum update rate when the instrument is running continuously, and a second deep memory depth is chosen for use when the user issues a stop command and the instrument is no longer running continuously. For instance, the first memory depth may take about 10% of the acquisition memory 36 for storing short fast acquisitions, while the second deep memory depth may take about 90% of the acquisition memory 36 (i.e., the remainder of the acquisition memory 36) in order that the maximum amount of data possible is captured for detailed examination by the user in a stop mode. Note that the second memory depth is set so as not to overwrite the last record taken at the faster update rate, as described below in detail.

Accordingly, when the update rate is important to the user, the instrument is operated at the maximum update rate possible. However, when the memory depth is important to the user (even if the user does not realize this), the instrument provides a maximum memory depth acquisition. A particular advantage to this is that the user is not required to understand digital acquisition systems, nor is the user required to make determinations as to how much memory depth is needed in order to optimize operation of the DSO 12.

Figure 4:
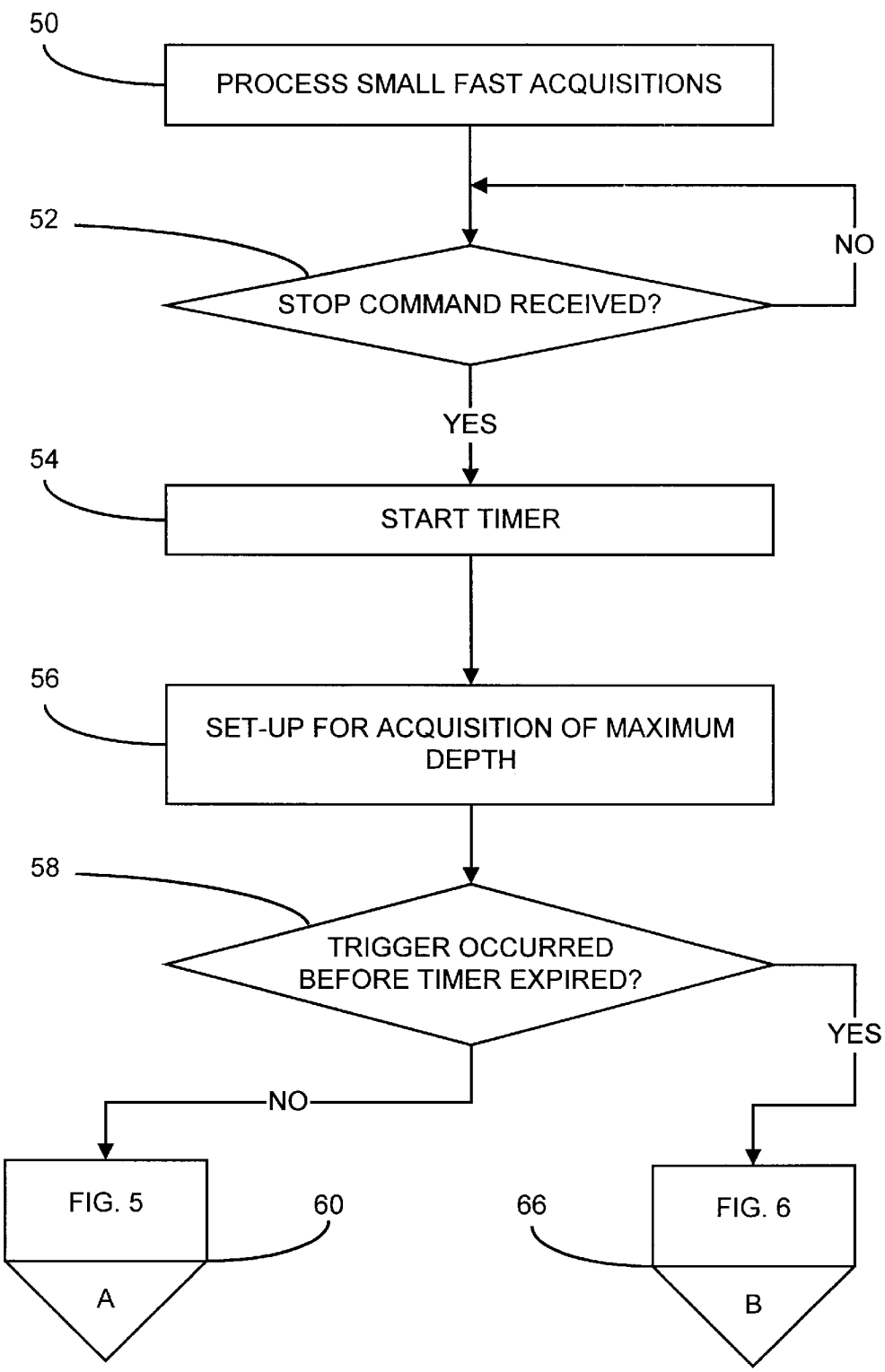
FIG. 4 is a flowchart of the operations of the acquisition system of FIG. 2.

With reference now to FIG. 4, the operation of the acquisition system 10 initially begins with the processing of small fast acquisitions in a continuous running mode, as indicated by block 50. At this point, the acquisition system 10 is configured to operate at an optimum update rate via the acquisition manager 30, only capturing enough data to represent the amount of time displayed on display device 27. Each record of data acquired at each trigger is temporarily stored in the acquisition memory 36 prior to being sent to display memory 25. Because only small records are being acquired at this point, only a small portion of the acquisition memory 36 is being utilized.

At block 52, the DSO 12 then waits for a stop command from the user, often indicating that the user desires to examine specific details of the stopped (frozen) waveform. Once a stop command has been received, block 52 transfers to block 54 where the acquisition manager 30 starts a timer. It is noted that the DSO 12 does not have to respond to the user's commands instantaneously in order for the response of the DSO 12 to appear instantaneous to the user. It is known in the art that various operations (or tasks) can be performed by the DSO 12 in response to a user's command without the user having any perception of a delay. Generally, it is recognized that a delay of up to approximately 100 milliseconds can occur without the user noticing that the response was not instantaneously. Thus, for purposes of the present invention, a timer is provided by the acquisition manager 30 for marking a window of time within which the acquisition manager 30 can perform certain tasks implementing the present invention. In the preferred embodiment, the timer is set for 100 milliseconds. It is within this window of time that the acquisition manager 30 preferably takes the deep memory acquisition that is eventually displayed on display device 26 for detailed examination by the user.

Referring back to FIG. 4, once the timer is started, block 54 transfers to block 56 where the acquisition manager 30 sets up for an acquisition of maximum depth. Specifically, the settings of the acquisition system 10 that are set for small fast acquisitions are changed so that the acquisition system is prepared to capture a record of the maximum possible depth upon the occurrence of the next trigger. In the preferred embodiment, the maximum depth possible is the amount of the acquisition memory 36 that is available to write into without overwriting the last acquired smaller record that is currently being displayed on the screen. For example, if the acquisition memory 36 has only 1,000,000 data points of memory available, and it was capturing 10,000 data points in the continuous operation mode, then it could capture as many as 990,000 data points without writing over the data points that are currently being displayed, that is, the data points of the last record acquired at the optimum update rate. The old data is necessarily not overwritten in case another trigger does not occur before the timer expires, and the DSO 12 is relegated to displaying the smaller record. It is worth noting that the maximum depth may at times be less than the available acquisition memory for a variety of reasons. For instance, it may be desirable to have the maximum memory depth set to one-half the acquisition memory 36 because the hardware of the DSO 12 requires that the acquisition memory 36 be divided into two parts of equal size. In such a case, a record captured during continuous running would be stored in a first part of the memory where it may actually only occupy a portion of that memory space, and a record capture during a deep memory aquisition would be stored in a second part of the memory where it may occupy that entire memory space.

If a subsequent trigger does not occur within the predefined window of time after the stop command is issued by the user, then the acquisition manager 30 leaves the smaller record already being displayed in the display memory 25. Accordingly, in order to provide the user with apparently instantaneous response to their request to stop the display, the acquisition manager 30 stops trying to capture a larger acquisition and simply allows the user to look at the data that was captured in the last small acquisition. The user can then pan and zoom the shorter record of data though there is less data to examine than if a deep memory acquisition were taken. Otherwise, waiting a longer period of time for a subsequent trigger may create a noticeable delay in the display data which is undesirable in that stopping is of primary importance when a stop request is received from the user and acquiring a deep memory record is of secondary importance.

Accordingly, at block 56, the acquisition manager 30 sets up the acquisition parameters including the number of points to be captured, the number of points before the trigger, and the number of points after the trigger. In addition, the acquisition manager 30 determines the new update rate, how the data will be written to display memory 25, and where to place data in display memory 25.

Next, block 58 determines whether a trigger occurs before the timer expires. If a trigger does not occur before the timer expires, the data of the last memory acquisition continues to be displayed as indicated at block 60 of FIG. 5. If, however, a trigger occurs before the timer expires, block 58 transfers to block 66 of FIG. 6.

Figure 5:
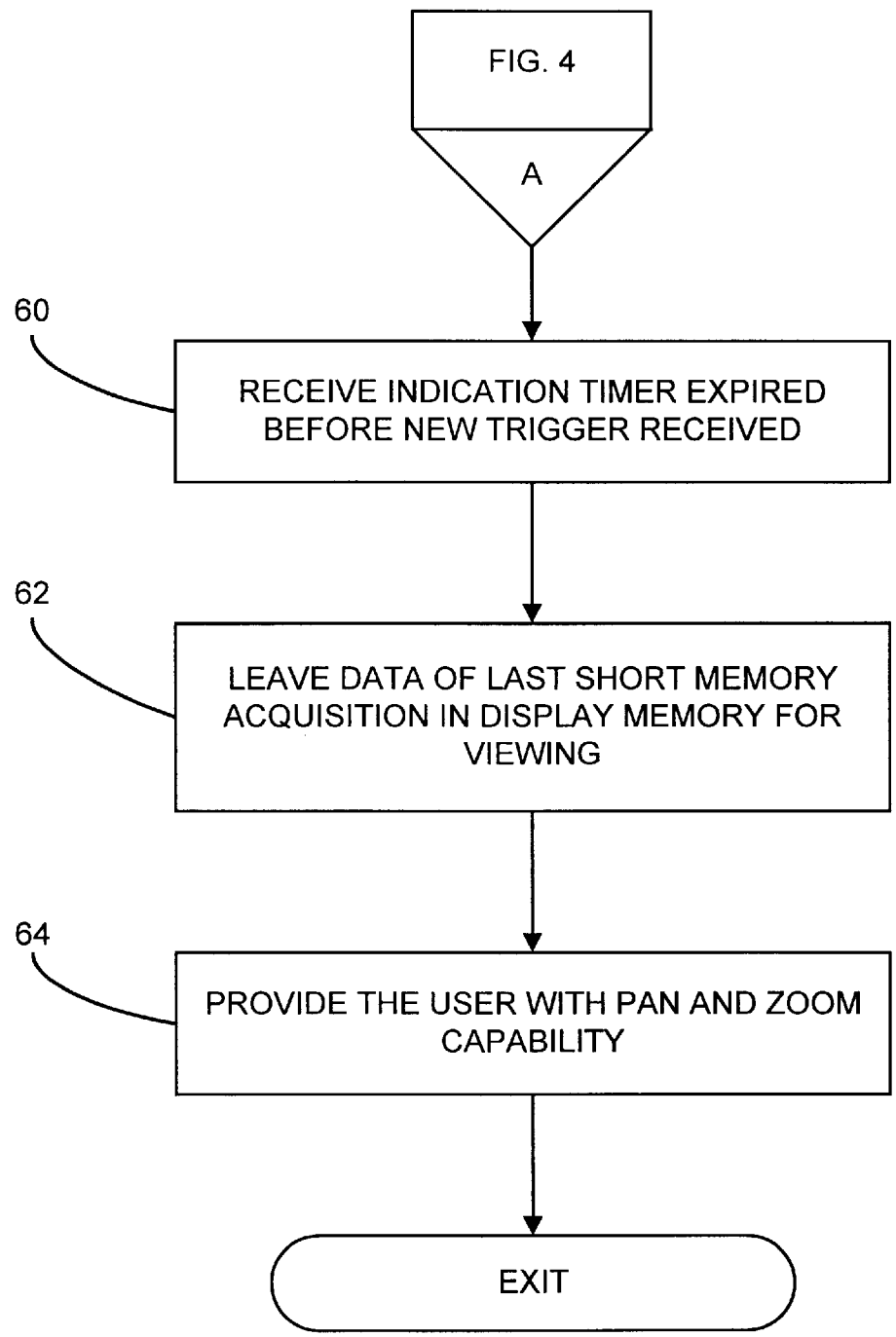
FIG. 5 is a flowchart of the operation of the acquisition system of FIG. 2 wherein a trigger does not occur before the timer expires.

With reference to FIG. 5, illustrated is the operation of the acquisition manager 30 in displaying the shorter record of data taken at the fast update rate. First, it is noted at block 60 that the acquisition manager 30 receives indication of the timer expired before a subsequent trigger was received. Consequently, the acquisition manager 30 leaves the data from the last short acquisition in the display memory 25 for viewing at the display device 27, as indicated in block 62. Following the action of block 62, the user is provided with pan and zoom capability at block 64 in order to closely examine the waveform data.

Figure 6:
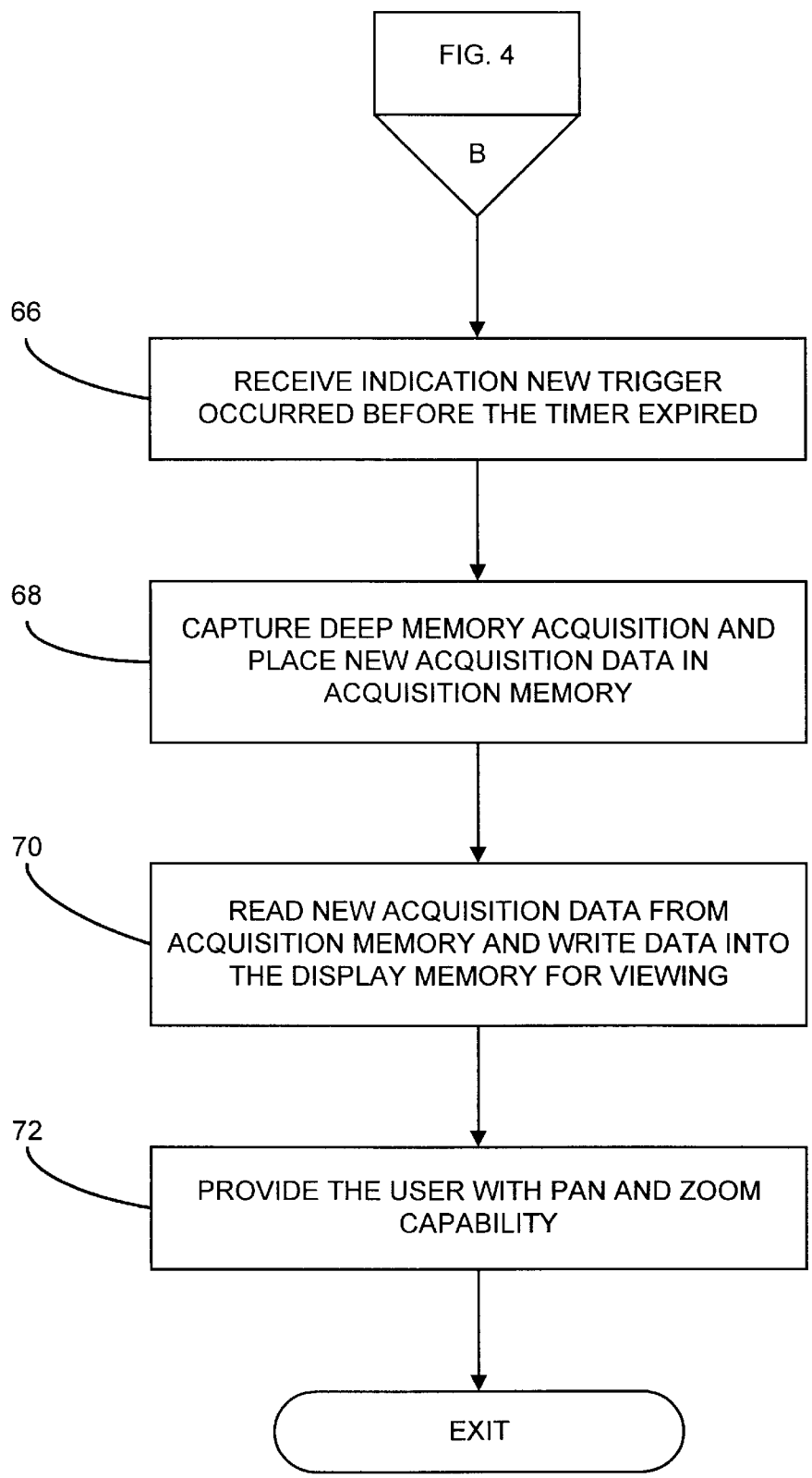
FIG. 6 is a flowchart of the operation of the acquisition system of FIG. 2 wherein a trigger occurs before the timer expires.

With specific reference to FIG. 6, it is first noted by the acquisition manager 30 that a new trigger was received before the timer expired, as indicated at block 66. Next, at block 68, a deep memory acquisition is taken to capture a new larger record, as described hereinbefore, and the new record is placed in the acquisition memory 36. At block 70, the acquisition manager reads the new acquisition data from the acquisition memory 36 and writes out the data into the display memory 25 for viewing at display device 27. Following block 70, the user is provided with pan and zoom capability at block 72 in order to closely examine the waveform data of the deep memory acquisition which is much larger than the record of the short memory acquisition. Therefore, the deep memory acquisition creates a new record of data stored in the acquisition memory 36 that represents much more time than represented by the previous short acquisition.

An example of the usefulness of the larger memory acquisition is when the user wishes to examine a specific event of a waveform. For purposes of this example, assume that the shorter memory acquisitions represent one millisecond of data (i.e., a small record), and that the deep memory acquisitions represent fifty times that of the smaller acquisitions, or fifty milliseconds of data (i.e., a large record). If the user wants to pan and zoom the data to look for a specific event that occurs only every fifty milliseconds, then the user only has a 2 percent chance of finding that event in data captured with the smaller memory acquisition and a 100 percent chance of finding that event in data captured with the deep memory acquisition.

In concluding the detailed description, it should be noted that it will be obvious to those skilled in the art that many variations and modifications may be made to the preferred embodiment without substantially departing from the principles of the invention. All such variations and modifications are intended to be included herein within the scope of the present invention, as set forth in the following claims. Further, in the claims hereafter, the structures, materials, acts, and equivalents of all means or step plus function elements are intended to include any structures, materials, or acts for performing the recited functions.

Wherefore, the following is claimed:

1. A method for digital acquisition in a digital waveform acquisition system, comprising the steps of:

capturing a first data record, having a first record length, from a data stream at a first update rate before a stop command is detected by said acquisition system;

capturing a second data record, having a second record length longer than said first record length, from said data stream at a second update rate after said stop command is detected by said acquisition system displaying said first data record before said stop command is detected by said acquisition system; and displaying said second data record after said stop command is detected by said acquisition system.

2. The method of claim 1, further comprising the step of taking said second data record at a trigger received after said stop command is detected by said acquisition system.

3. The method of claim 2, further comprising the step of taking said second data record if said trigger occurs within a predetermined period of time after said stop command is detected.

4. The method of claim 3, wherein said predetermined period of time is approximately 100 milliseconds.

5. A method of digital acquisition in a digital waveform acquisition system, comprising the steps of:

displaying data from a short memory record having a first record length and captured at a first update rate before a stop command is detected by said acquisition system;

detecting said stop command;

capturing a deep memory record having a second record length longer than said first record length at a second update rate after said stop command is detected by said acquisition system; and displaying data from said deep memory record if a trigger occurs within a predetermined period of time after said stop command is detected.

6. The method of claim 5, further including the step of providing a user with pan and zoom viewing capability.

7. The method of claim 5, wherein said step of displaying said deep memory record includes the step of storing data captured and then transferring said captured data to a display memory.

8. The method of claim 5, further including the step of transferring said deep memory record from an acquisition memory to a display memory after said stop command is detected.

9. The method of claim 5, wherein said predetermined period of time is approximately 100 milliseconds.

10. The method of claim 5, further including the step of determining said second update rate wherein said second update rate is slower than said first update rate.

11. The method of claim 5, further including the step of determining a length of said deep memory record.

12. The method of claim 5, further including the step of determining an amount of data captured in said deep memory record before and after said trigger.

13. A digital acquisition system, comprising:

a user interface mechanism for detecting a stop command;

an acquisition manager for storing a memory record having a first record length and captured at an first update rate before a stop command is detected by said acquisition system, and for adjusting an acquisition parameter for capturing a deep memory record, having a second record length longer than said first record length at a second update rate after said stop command is detected;

a timer for allowing said acquisition manager a predetermined time period to capture said deep memory record; and a display for displaying data captured in said deep memory acquisition.

14. The system of claim 13, wherein said acquisition parameter corresponds to a length of said deep memory record.

15. The system of claim 13, wherein said acquisition manager is configured to determine an amount of data captured in said deep memory record before and after a trigger.

16. The system of claim 13, wherein said predetermined time period is approximately 100 milliseconds.

17. An acquisition manager for a digital acquisition system, comprising:

a memory depth mechanism for changing a memory depth of said digital acquisition system when acquiring a record after a stop command is received by said digital acquisition system;

a trigger mechanism for recording a status of a trigger associated with each said record acquired; and a display update mechanism for updating a display device of said digital acquisition system with each acquired record.

* * * * *